United States Patent [19]

Carr

[11] Patent Number: 5,210,922
[45] Date of Patent: May 18, 1993

[54] ACQUIRING AND MAINTAINING SUPPORT FOR AND REGISTRATION WITH EACH BOARD DURING DEPANELING AND TRANSFERRING OF EACH LIBERATED BOARD TO A SUBSEQUENT STATION

[75] Inventor: D. Patrick Carr, Longmont, Colo.
[73] Assignee: Cencorp, Inc., Longmont, Colo.
[21] Appl. No.: 802,819
[22] Filed: Dec. 6, 1991
[51] Int. Cl.⁵ .............................................. B23P 19/00
[52] U.S. Cl. ................................. 29/426.3; 29/426.4; 29/791; 29/822
[58] Field of Search ..................... 29/426.3, 426.4, 791, 29/822, 403.3, 412, 414

[56] References Cited

U.S. PATENT DOCUMENTS

| | | | |
|---|---|---|---|
| 5,001,870 | 3/1991 | Yokota et al. | 29/426.3 X |
| 5,027,505 | 7/1991 | Nakamura et al. | 29/426.3 X |
| 5,117,554 | 6/1992 | Grabow | 29/791 |

Primary Examiner—Joseph M. Gorski
Attorney, Agent, or Firm—Wegner, Cantor, Mueller & Player

[57] ABSTRACT

Each board of a multi-board panel is gripped and registration is established by engagement with tooling of the transfer arm of an in-line machine in preparation for a routing process by which the boards are to be liberated from the panel (depaneled). The tooling supports each board and maintains registration therewith during liberation of the board from the multi-board panel and also during transfer of the liberated board to a selected one of several sites of a subsequent station via repositioning of the transfer arm. In one embodiment of the invention, registration is accomplished by inserting lengthwise-bifurcated locator pins into corresponding locator holes in the boards and expanding the bifurcated legs into locking engagement with the panel by longitudinal displacement of a tapered rod which is disposed between the legs.

24 Claims, 6 Drawing Sheets

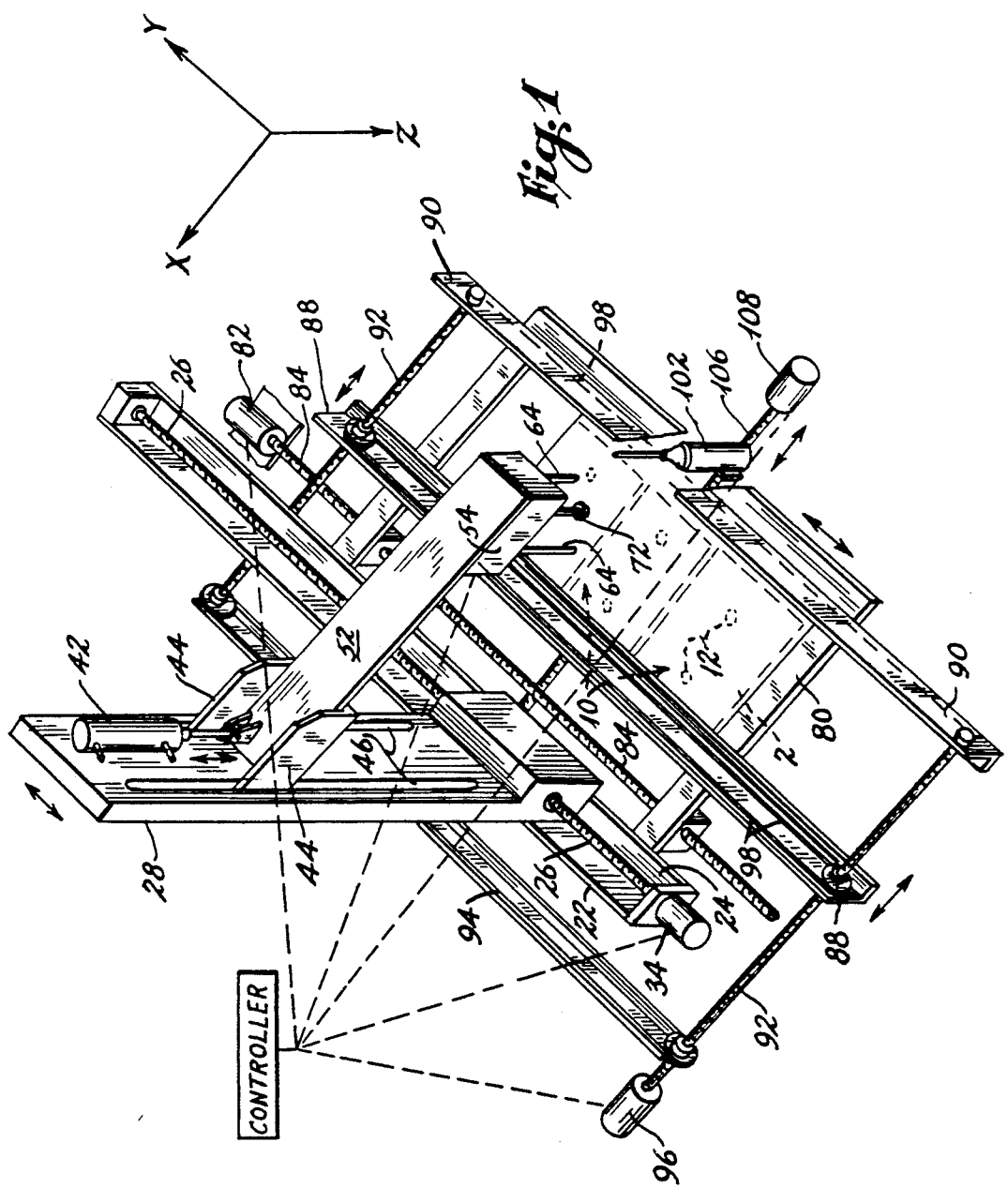

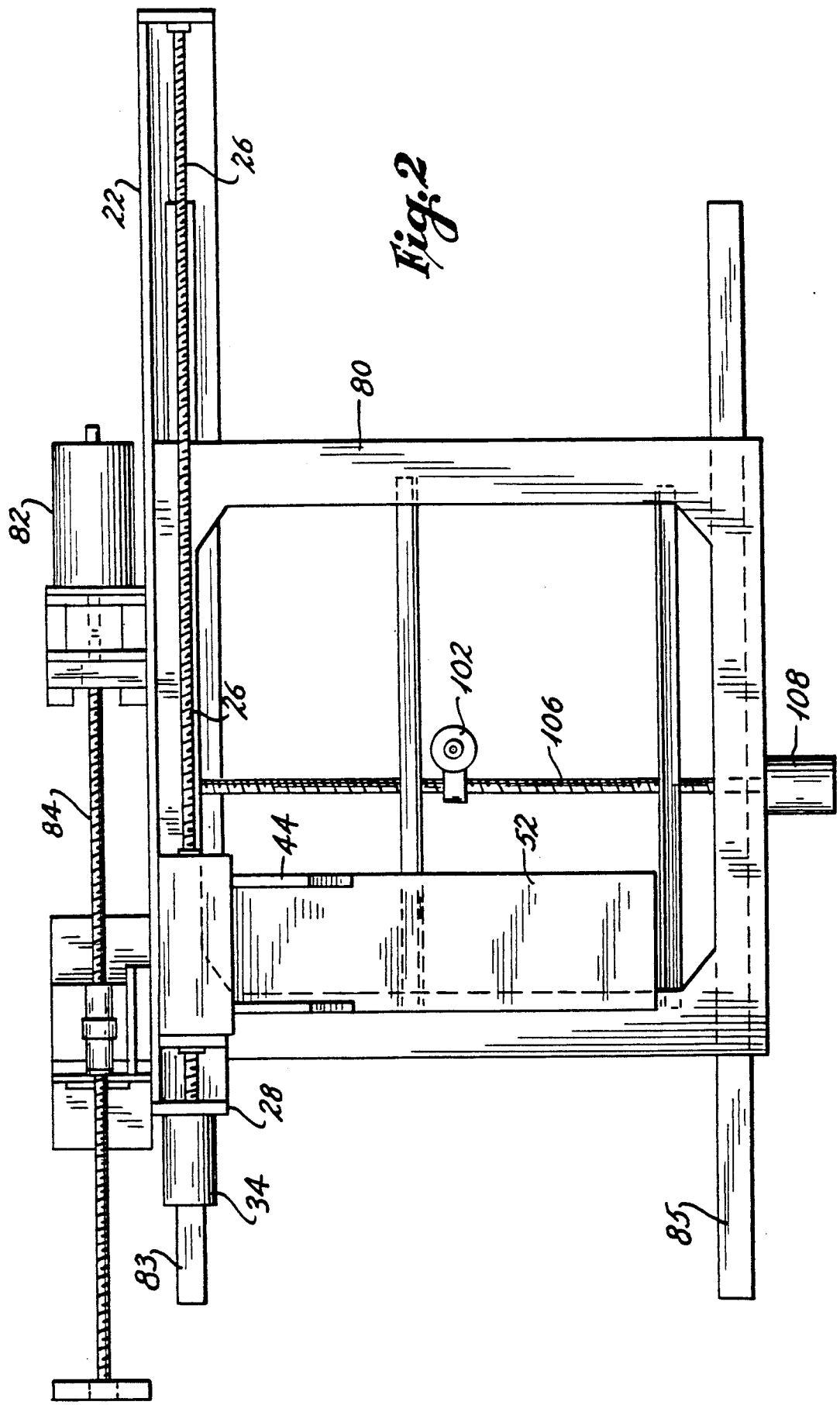

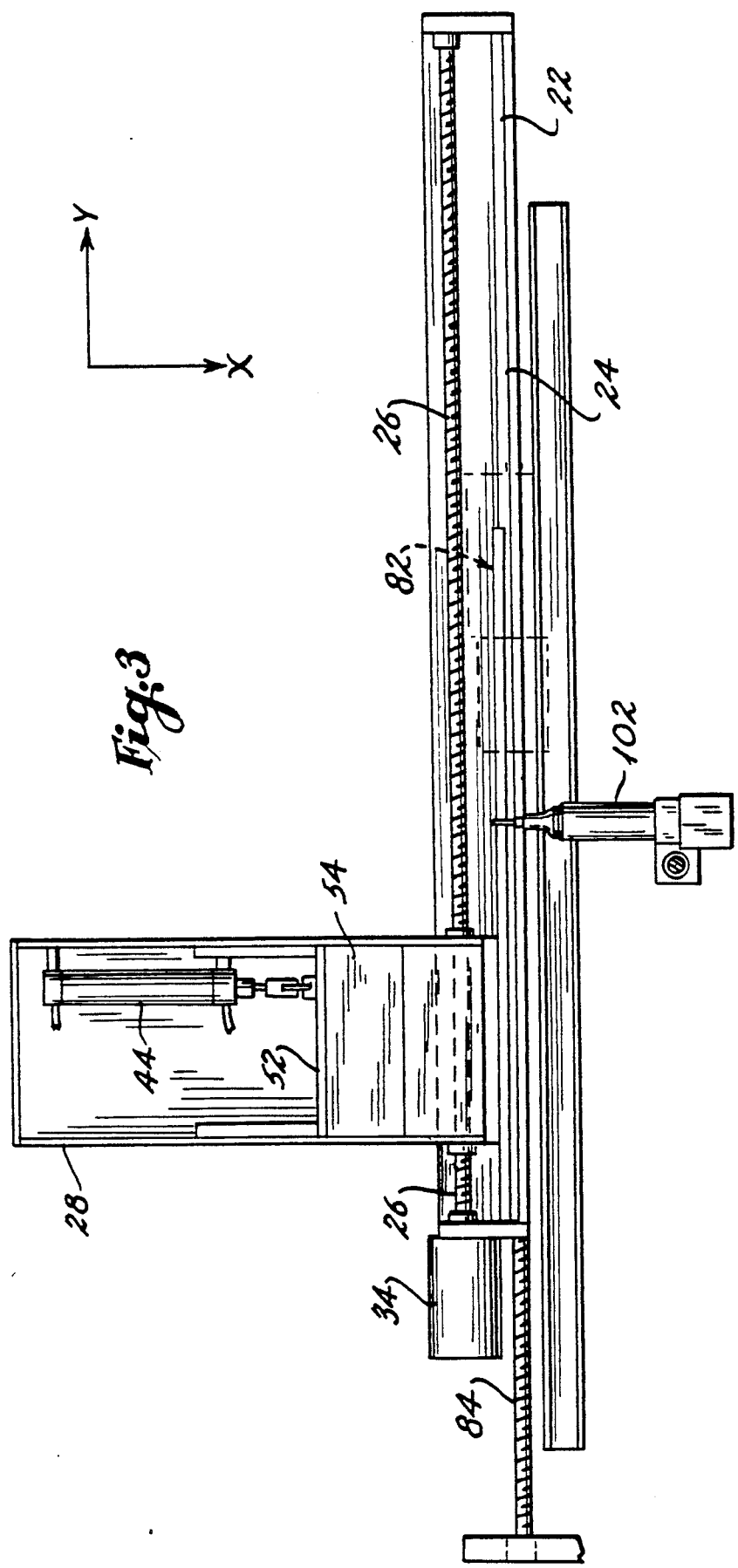

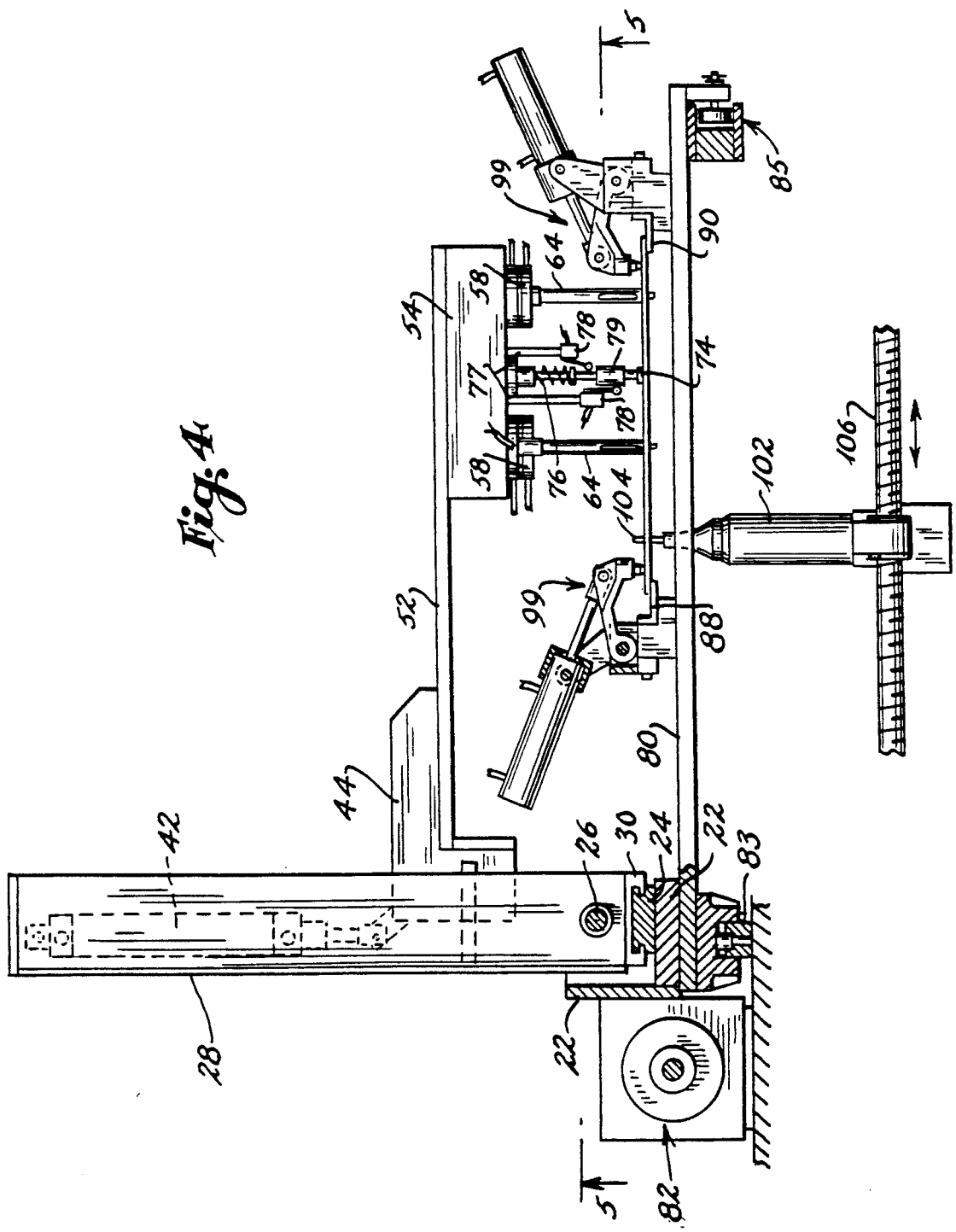

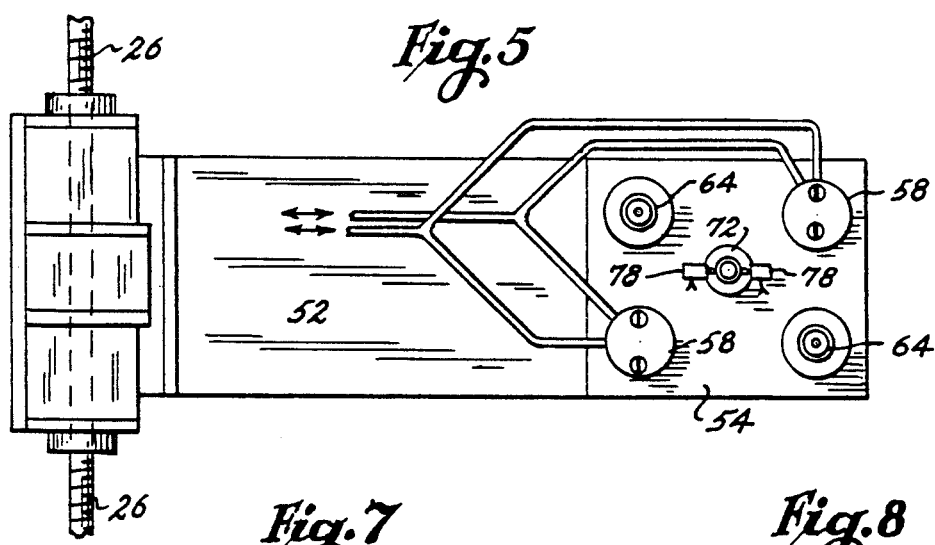
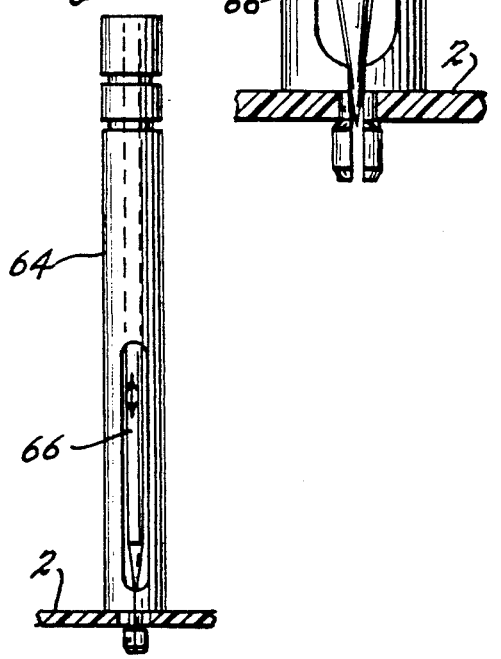
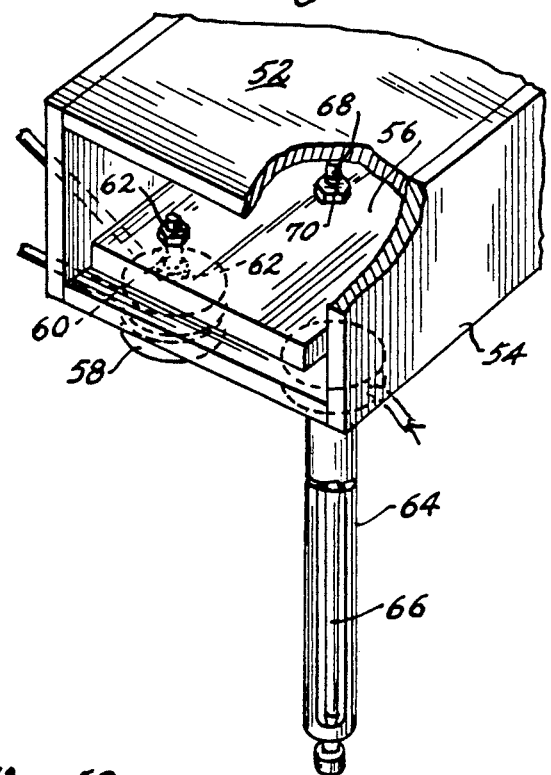
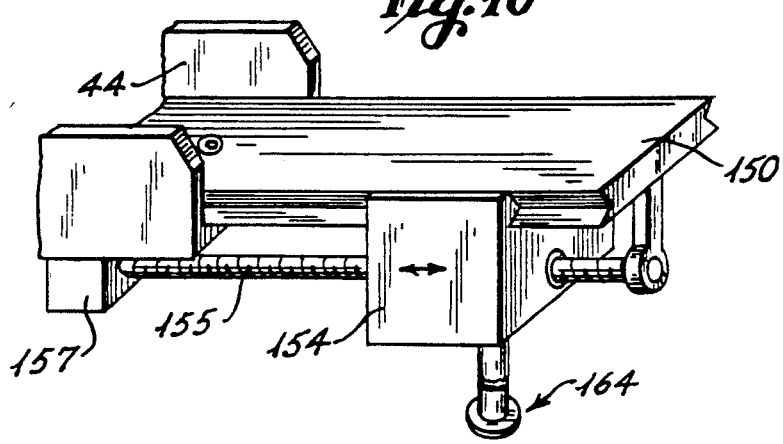

ACQUIRING AND MAINTAINING SUPPORT FOR AND REGISTRATION WITH EACH BOARD DURING DEPANELING AND TRANSFERRING OF EACH LIBERATED BOARD TO A SUBSEQUENT STATION

PRIOR ART CROSS REFERENCES

U.S. Pat. No. 4,762,578—Burgin, Jr., et al.—NON-CONTACT SENSING AND CONTROLLING OF SPACING BETWEEN A DEPOSITING TIP AND EACH SELECTED DEPOSITING LOCATION ON A SUBSTRATE—issued Aug. 9, 1988.

U.S. Pat. No. 4,812,666—Wistrand—POSITION FEEDBACK ENHANCEMENT OVER A LIMITED REPOSITIONING AREA FOR A MOVEABLE MEMBER—issued Mar. 14, 1989.

U.S. Pat. No. 4,938,087—Ragard—ZERO BACKLASH POSITIONING SYSTEM FOR A MOVABLE LINEAR AXIS—issued Jul. 3, 1990.

GLOSSARY OF TERMS

Board: an individual printed circuit board.

Multi-board panel: a panel containing an array of boards of which the peripheries of each board may or may not have been partially routed from the panel.

Depaneling: a process of removing or liberating a board from a panel.

Registration: recognition of the locations (in X,Y, and Z,) of particular features of a panel or board, as required by the situation, relative to a "home" position of a machine. Typically, it is accomplished by (i) inserting locator pins of the machine into locator holes of the panel or board, or (ii) using a vision system to find fiducials or particular "landmarks" which are on the panel or board and to locate these features relative to the home position of the machine.

BACKGROUND OF THE INVENTION

The invention is in the field of substrate handling and deals with the handling of multi-board panels containing an array of printed circuit boards (hereafter referred to as boards) by machinery which is adapted to depanel or liberate each board from the panel. Some of the panels have had little or no routing around the peripheries of the individual boards prior to handling by such a machine. Others of the panels have been routed to an extent that only small tabs or webs of the paneling material remain to hold the boards in the panel with sufficient rigidity that they remain attached during automated population of the boards with electrical components. The latter type of panel generally is referred to in the industry involved as a slotted and webbed (or tabbed) array.

More particularly, the invention deals with so-called in-line handling of the multi-board panels for the purpose of depaneling or liberating boards therefrom. Flexible in-line depaneling has been an illusive technology because of the difficulty in automatically handling the individual boards after depanelization. Unlike the multi-board panel, the individual boards present widely varying sizes and shapes which generally are not designed with automatic handling of the separated boards in mind.

As a result, previous methods and apparatus for in-line depaneling have involved loss of registration between the machine and the individual board upon liberation of the board from the panel. With this prior art, a "re-registration" step is required, either by human intervention or by another machine operation, in order to be able to operate on the board with the precise control required by some processes that may need to be performed on it. Such re-registration of the individual boards introduces another level of difficulty and a resulting loss of time into the board handling process, especially when the boards vary in size and/or shape.

The invention avoids this problem by gripping each board prior to depaneling being performed and in a manner to provide and/or maintain registration between the board and machine for liberation of the board from the panel and during transfer of the liberated board from the routing station to a subsequent station.

Thus, it is an object of this invention to obtain and/or retain registered control of individual boards for, during, and after processing of a multi-board panel.

Additionally, it is an object of the invention to physically support each individual board as it is liberated from a panel and to retain registration between the machine and each board during a depaneling process.

Further, it is an object of the invention to retain registration between the machine and each board during support and transfer thereof away from a depaneling station to a subsequent station.

These and other objects will become apparent from the following disclosure.

BRIEF SUMMARY OF THE INVENTION

Each board of a multi-board panel is gripped and registration is established by engagement with tooling of the transfer arm of an in-line machine in preparation for a routing process by which the boards are to be liberated from the panel (depaneled) The tooling supports each board and maintains registration therewith during liberation of the board from the multi-board panel and also during transfer of the liberated board to a selected one of several sites of a subsequent station via repositioning of the transfer arm. In one embodiment of the invention, registration is accomplished by inserting lengthwise-bifurcated locator pins into corresponding locator holes in the boards and expanding the bifurcated legs into locking engagement with the panel by longitudinal displacement of a tapered rod which is disposed between the legs.

BRIEF DESCRIPTION OF THE DRAWINGS

FIG. 1 is a partial isometric view illustrating the major mechanical porttions of the machine and their movements.

FIG. 2 partial top plan view of the machine of the invention.

FIG. 3 is a front elevation of the device of FIG. 2.

FIG. 4 is a left side elevation, partially in cross-section, of the device of FIG. 2, with the addition of a multi-board panel registered with and clamped to the table and an individual board registered with and gripped by the tooling of the transfer arm.

FIG. 5 is a plan view of the transfer arm, as viewed generally in the direction of arrows 5—5 of FIG. 4.

FIG. 6 is an elevational view of the bifurcated locator pin of the transfer arm tooling.

FIG. 7 is an enlarged view of the tip of the bifurcated pin of FIG. 6.

FIG. 8 is a partial isometric view of the tooling assembly, with the end plate removed to illustrate how the locator pins are actuated.

FIG. 10 is a partial isometric view illustrating an alternate embodiment of the tooling assembly.

DETAILED DESCRIPTION OF THE INVENTION

Figure 9:
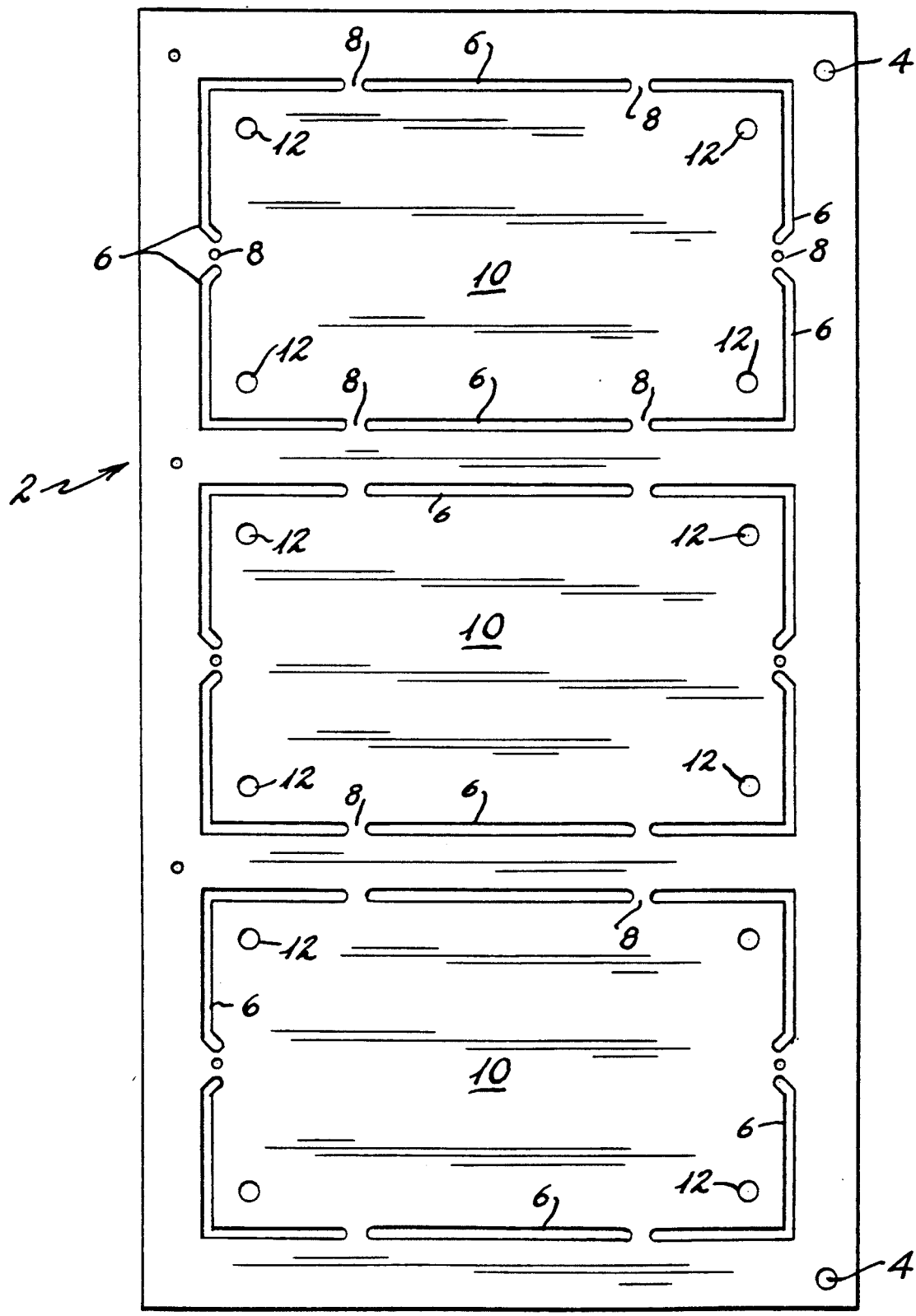
FIG. 9 a top plan view of a multi-board panel having a so-called "tabbed array".

One form of multi-board panel 2 is illustrated in FIG. 9 as a slotted and tabbed array of individual boards 10 whose peripheries are generally defined by slots 6 and tabs 8. Panel registration holes 4 and board registration holes 12 have been provided as the particular features to be recognized and located by the machine in order to acquire registration therewith.

Referring to FIG. 1, a controller is in communication with servo motors with rotary encoders 34, 82, 96, and 108 as well as with the control valves for cylinders 42 and 58 and with the sensor switches 78 (cylinders 58 and switches 78 are best seen in FIG. 4). Additionally, the controller is in communication with router motor 102. The controller is typically an IBM PC/XT compatible unit with keyboard and monitor which stores programs, coordinates machine operations, provides diagnostic status information, and provides for on-line programming.

The major movable portions of the machine of the invention may be better understood by referring to FIG. 1, in which it may be seen that a table 80 is selectively displaceable in the Y-direction by means of lead screw 84 and motor and encoder 82. A board guide and feed assembly is mounted on the table 80 and comprises a track 90 which is affixed to table 80 and a track 88 which is displaceable in the X-direction relative to fixed track 90 in order to accommodate multi-board panels 2 of various widths. Selected movement of track 88 toward and away from fixed track 90 is provided by lead screws 92 and motor and encoder 96, with timing chain 94 providing for ganged rotation of lead screws 92. Each track 88 and 90 has associated therewith an endless conveyor belt 98 for feeding the panel 2 into position on the table 80 for registration with the machine, as will be described in the following.

Although not illustrated in detail in the drawings, any means for driving the conveyor belts 98 may be provided, such as a square rod passing through the centers of a drive pulley for each belt in a manner that allows the movable track 88 to be displaced along the length of the rod having a square cross-section. Such a rod may be driven in an appropriate manner such as by attachment to a motor and encoder which would be in communication with the controller.

As seen in FIG. 4, the table 80 which is displaceable by motor 82 and lead screw 84 is supported for such displacement by means of a guide and roller arrangement 85 on one side and a slide and guide arrangement 83 on the other side.

Also mounted on the displaceable table 80 is a transfer arm assembly comprising an L-shaped bracket 22 having a track 24 and lead screw 26 mounted thereon. A vertical bracket and housing 28 has a guide bracket 30 on the bottom thereof which holds the vertical bracket 28 to the track 24 for sliding movement therealong, with such sliding movement being provided by a Y-drive assembly. The Y-drive assembly comprises the lead screw 26 selectively driven by a rotary motor and encoder 34.

An elevator bracket 44 extends through slots 46 of the vertical housing 28 and is driven up and down in the Z-direction by means of pneumatic cylinder 42 (and valving thereof in accordance with the controller). As seen in FIGS. 1 and 4, a tooling assembly arm 52 is interchangeably attachable to elevator bracket 44 by machine screws or the like and has a housing 54 at the unattached end thereof. Referring to FIGS. 1, 4, 5, and 8, member 54 houses an actuation plate 56 (FIG. 8) which is attached b threaded rod 60 and nuts 62 to one or more pneumatic cylinders 58 so as to be raised and lowered in the Z-direction according to actuation of cylinders 58. In turn, actuation plate 56 is also connected to rod 66 by threading 68 and nut 70. As best seen in FIGS. 6–8, the opposite end of rod 66 has a conical tip and is telescopic within a bifurcated locator pin 64 such that extension of the conical-tipped rod 66 downwardly spreads the legs of the bifurcated pin 64. As seen in FIG. 7, this feature allows the pin 64 to be inserted through the hole of a circuit board 2 and to be spread into gripping engagement therewith.

As best seen in FIG. 4, a sensor assembly depends from the bottom of housing 54 and comprises a board engaging tip 74 which is biased downwardly by spring 76 and has a switch actuating collar 79 for actuating limits switches 78 which are mounted on brackets 77. Upper limit switch 78 is actuated when the spring biased sensor is retracted by an amount corresponding to proper insertion of the bifurcated pin into a registration hole of the circuit board. The lower limit switch 78 is actuated by collar 79 upon extension of the tip 74 by spring 76 when no board is engaged.

A router 102 is displaceable in the X-direction along a lead screw 106 according to a rotary motor and encoder 108.

GENERAL OPERATION OF THE OVERALL DEVICE

A multi-board panel is supplied to the lower left hand end (FIG. 1) of conveyor belts 98 and the panel 2 is fed forward by conveyor belts 98 until a leading edge thereof is sensed by a well known sensor (not shown) whereupon panel registration clamps 99 (FIG. 4) are engaged in panel registration holes 4 or the like. During feeding of the panel to the registered position, the router 102 has been lowered and arm 52 has been raised to non-interfering positions. Upon registration of the multi-board panel, cylinder 42 is actuated to lower arm 52 such that locator pins 64 are engaged in board registration holes 12 of an individual board 10 to a depth determined by the sensor assembly 72, whereupon lowering of arm 52 is halted and the bifurcated legs of locator pins 64 are spread to clamp the individual board 10 of the multi-board panel 2. Thus, registration is made with the individual board and the tabs 8 may be removed to liberate the individual board from the multi-board panel.

Such depaneling is performed by positioning the router 102 so that upon being raised it will position a router tip 104 within the slot 6 around the periphery of the board to be liberated. Thereafter, the router 102 is movable back and forth in the X-direction and the table 80 back and forth in the Y-direction, in concert, sufficiently to remove all tabs about the periphery of a board 10 and free it from the panel 2. Hence, the liberated board is only supported by the bifurcated registration pins 64, whereupon the arm 52 is elevated by actuation of cylinder 42 sufficiently to clear the remainder of the panel 2, and motor 34 is actuated to drive the vertical housing 28 in the Y-direction relative to table 80 so as to transport the liberated board away from the multi-board panel 2.

As may be appreciated, the L-shaped bracket 22 is of sufficient length that the liberated board may be transported to the subsequent station which is clear of the rear of the conveyor belts 98. At the subsequent station, the arm 52 is lowered and the bifurcated pins are released from the board to place it at a particular desired position along the Y-direction at the subsequent station.

Thereafter, the arm 52 is elevated and repositioned along the Y-direction and re-registered with the next board which is to be liberated from the panel 2.

In some instances, it is preferable to be able to position the liberated board in both the X- and Y-directions to a particular location at the subsequent station. FIG. 10 illustrates an embodiment by which the additional positioning in the X-direction may be performed. As seen in FIG. 10, the arm 150 has the housing 154 reciprocatable along the length thereof by means of a slide and guide arrangement and a lead screw 155 which is selectively driven by motor and rotary encoder 157. FIG. 10 also illustrates the use of a vacuum nozzle 164, instead of the bifurcated pins 64, as another means by which the board may be gripped and supported and registration may be retained. A sensor is not illustrated in FIG. 10, but various forms of sensors may be utilized including pressure sensing or optical sensing as provided in the prior art cross referenced into this application. Other means of supporting and moving a cantilevered arm or portion thereof is also disclosed in U.S. Pat. No. 4,938,087, cross referenced herein.

Thus, the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

For instance, it is considered to be well within the concept of the invention to provide other gripping means, such as edge grippers. It is also to be understood that the following claims are intended to cover all of the generic and specific features of the invention herein described, and all statements of the scope of the invention which, as a matter of language, might be said to fall therebetween.

Now that the invention has been described, I claim:

1. In a method of handling a panel having an array of substrates or boards interconnected with said panel so as to constitute a multi-board panel, and comprising the steps of liberating at elast one board from said panel and transferring said board to a subsequent station, the improvement comprising the steps of:
   providing a transfer arm;
   registering said transfer arm with said board;
   supporting said board by said transfer arm as said board is liberated from said panel; and
   retaining registration between said transfer arm and said board during and after said liberating of said board from said panel.

2. The method as in claim 1, and further comprising the steps of:
   transferring said board by said transfer arm, from a processing station at which said liberating is accomplished to a subsequent station;
   depositing said board at said subsequent station; and
   maintaining said registration during said transferring and depositing.

3. The method as in claim 2, and further comprising the step of:
   selecting one of several possible depositing sites of said subsequent station;
   controlling movement of said arm orthogonally in three dimensions during transferring to and depositing at said one site.

4. The method as in claim 1, wherein said liberating comprises the step of:
   routing said board from said panel.

5. The method as in claim 1, wherein said liberating comprises the step of:
   routing only tabs of said panel so as to accomplish said liberating.

6. The method of claim 1, and further comprising the step of:
   inserting locator pins into corresponding locator holes of said panel in order to accomplish said registering with said board.

7. The method as in claim 1, and further comprisign the step of:
   utilizing a vision system in order to accomplish said registering.

8. The method as in claim 1, wherein different boards present different physical features, and further comprising the step of:
   providing that at least a portion of said transfer arm is interchangeable in order to accommodate said different features and thus support said different boards.

9. The method as in claim 1, and further comprising the steps of:
   providing a movable table;
   supporting said transfer arm on said table;
   registering said panel with said table;
   gripping said board directly with said transfer arm;
   moving said table and arm in concert during and in order to accomplish said liberating; and
   moving said arm relative to said table in order to accomplish said transferring.

10. In an apparatus for handling a panel having an array of substrates or boards interconnected with said panel so as to constitute a multi-board panel, said apparatus having means for liberating at least one board from said panel and transferring said board to a subsequent station, the improvement comprising:
    a transfer arm;
    means for registering said transfer arm with said board;
    means for supporting said board by said transfer arm as said board is liberated from said panel and retaining registration between said transfer arm and said board during and after said liberating of said board from said panel.

11. An apparatus as in claim 10, and further comprising:
    means for transferring said board by said transfer arm, from a processing station at which said liberating is accomplished to a subsequent station;
    means for depositing said board at said subsequent station; and
    means for maintaining said registration during said transferring and depositing.

12. The method as in claim 11, and further comprising:

means for selecting one of several possible depositing sites of said subsequent station;

means for controlling movement of said arm orthogonally in three dimensions during transferring to and depositing at said one site.

13. The method as in claim 10, wherein said means for liberating comprises:

means for routing said board from said panel.

14. An apparatus as in claim 10, wherein said registering means comprises:

a vision system.

15. An apparatus as in claim 10, wherein different boards present different physical features, said apparatus further comprising:

at least a portion of said transfer arm being interchangeable in order to accommodate said different features and thus support said different boards.

16. An apparatus as in claim 10, and further comprising:

a movable table;

means for supporting said transfer arm on said table;

means for registering said panel with said table;

means for gripping said board directly with said transfer arm;

means for moving said table and arm in concert during and in order to accomplish said liberating; and means for moving said arm relative to said table in order to accomplish said transferring.

17. In a method of handling a panel having an array of substrates or boards interconnected with said panel so as to constitute a multi-board panel, and comprising the steps of liberating at least one board from said panel and transferring said board to a subsequent station, the improvement comprising the steps of:

providing a transfer arm;

registering said transfer arm with said board;

supporting said board by said transfer arm as said board is liberated from said panel by inserting pins of said transfer arm into holes in said board and providing a frictional attachment between said pins and said board when said pins are in said holes; and retaining registration between said transfer arm and said board during said liberating of said board from said panel.

18. The method of claim 17, and further comprising the step of:

wedging said pins within said holes in order to accomplish said supporting and retaining.

19. In an apparatus for handling a panel having an array of substrates or boards interconnected with said panel so as to constitute a multi-board panel, said apparatus having means for liberating at least one board from said panel and transferring said board to a subsequent station, the improvement comprising:

a transfer arm having pins protruding therefrom;

means for registering said transfer arm with said board;

means for inserting said pins into holes in said board in order to support said board by said transfer arm as said board is liberated from said panel, and for retaining registration between said transfer arm and said board during said liberating of said board from said panel.

20. An apparatus as in claim 19, and further comprising:

means for wedging said pins within said holes in order to accomplish said supporting and retaining.

21. In a method of handling a panel having an array of substrates or boards interconnected with said panel so as to constitute a multi-board panel, and comprising the steps of liberating at least one board from said panel and transferring said board to a subsequent station, the improvement comprising the steps of:

providing a transfer arm;

registering said transfer arm with said board by inserting locator pins of said transfer arm into corresponding locator holes in said board;

supporting said board by said transfer arm as said board is liberated from said panel; and retaining registration between said transfer arm and said board during said liberating of said board from said panel.

22. In a method of handling a panel having an array of substrates or boards interconnected with said panel so as to constitute a multi-board panel, and comprising the steps of liberating at least one board from said panel and transferring said board to a subsequent station, the improvement comprising the steps of:

providing a transfer arm having a vacuum nozzle;

registering said transfer arm with said board;

applying vacuum to said vacuum nozzle;

supporting said board on said nozzle by said vacuum as said board is liberated from said panel; and retaining registration between said transfer arm and said board during said liberating of said board from said panel.

23. In an apparatus for handling a panel having an array of substrates or boards interconnected with said panel so as to constitute a multi-board panel, said apparatus having means for liberating at least one board from said panel and transferring said board to a subsequent station, the improvement comprising:

a transfer arm;

means for registering said transfer arm with said board, said registering means comprising locator pins depending from said transfer arm, locator holes in said board, and means for inserting said locator pins into said locator holes;

means for supporting said board by said transfer arm as said board is liberated from said panel, and for retaining registration between said transfer arm and said board during said liberating of said board from said panel.

24. In an apparatus for handling a panel having an array of substrates or boards interconnected with said panel so as to constitute a multi-board panel, said apparatus having means for liberating at least one board from said panel and transferring said board to a subsequent station, the improvement comprising:

a transfer arm;

means for registering said transfer arm with said board;

means for supporting said board by said transfer arm as said board is liberated from said panel, and for retaining registration between said transfer arm and said board during said liberating of said board from said panel, said supporting and retaining registration means comprising at least one vacuum nozzle.

* * * * *